United States Patent [19]

Engels et al.

[11] Patent Number: 5,396,086

[45] Date of Patent: Mar. 7, 1995

[54] LED SPACER ASSEMBLY

[75] Inventors: Walter Engels; Andrea Russo, both of Toms River, N.J.

[73] Assignee: Dialight Corporation, Manasquan, N.J.

[21] Appl. No.: 111,049

[22] Filed: Aug. 24, 1993

[51] Int. Cl.$^6$ ............................................. H01L 23/16
[52] U.S. Cl. ........................................ 257/99; 257/88; 257/680; 257/433; 257/714
[58] Field of Search .................... 257/80, 81, 82, 98, 257/99, 100, 433, 434, 680, 714

[56] References Cited

FOREIGN PATENT DOCUMENTS

| | | | |
|---|---|---|---|
| 0079161 | 5/1983 | European Pat. Off. | 257/99 |
| 58-002080 | 1/1983 | Japan | 257/99 |
| 1-194478 | 8/1989 | Japan | 257/99 |
| 3-046281 | 2/1991 | Japan | 257/99 |

*Primary Examiner*—Andrew J. James
*Assistant Examiner*—John F. Guay
*Attorney, Agent, or Firm*—Oblon, Spivak, McClelland, Maier & Neustadt

[57] ABSTRACT

An LED spacer assembly includes a housing having at least one first passageway which permits the insertion of an LED. The LED has leads which extend therefrom and pass through the first passageway of the housing. The housing also includes at least one second passageway which intersects the first passageway and includes an extended portion. The second passageway permits the insertion of a tool or forming die element for the purpose of holding the leads and forming a bent portion in the leads which extend into the extended portion of the second passageway. The positioning of the bent portion of the leads into the extended portion of the second passageway permits the stable retention of the LED on the housing. Additionally, by holding the leads during the bending of the same, stresses on the LED are minimized during the assembly process.

6 Claims, 3 Drawing Sheets

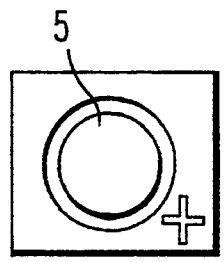
FIG. 7
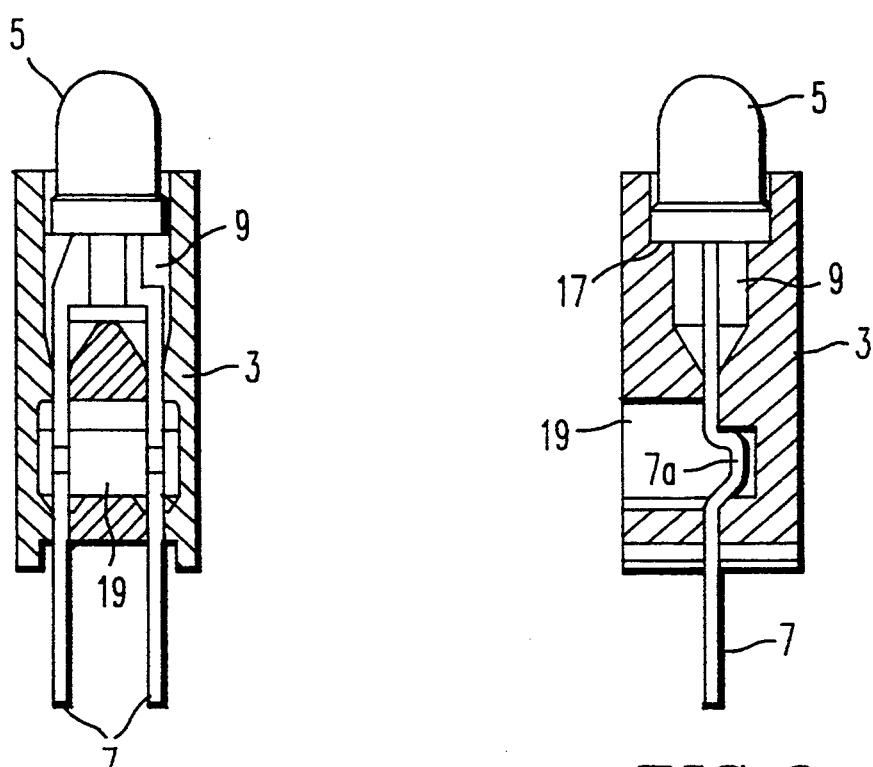
FIG. 5
FIG. 6

LED SPACER ASSEMBLY

FIELD OF THE INVENTION

The present invention relates to a vertical circuit board indicator spacer product which includes a housing for holding a single LED or a plurality of LEDs in a spaced manner. The spacer assembly of the present invention is designed so as to facilitate the manufacture of the LED spacer assembly in a semi-automated or fully automated assembly process and to improve the retention of the LED or LEDs on the housing of the spacer assembly.

BACKGROUND OF THE INVENTION

In conventional assemblies, the LEDs are glued to a housing or the assembly includes snap-in designs that work on flanges or leads of the LEDs.

The drawbacks with conventional assemblies are that the LEDs are not adequately fastened to the housing and that the process of gluing or snapping-in the LEDs to the housing creates stresses on the LEDs, specifically, on the connection between the LEDs and the leads. Snap-in designs typically engage with the LED flange and/or lead section immediately below the flange. Due to variations in design of LEDs from different manufacturers and wide dimensional tolerances on these details, it is very difficult to design snap-in spacers that work well consistently. With glued designs, long curing times reduce throughput and increase cost in manufacture. Most glues are toxic and vapors or possible skin contact represent health hazards during application.

OBJECT OF THE INVENTION

A principal object of the invention is to provide a novel LED spacer assembly which facilitates the attachment of a single LED or a plurality of LEDs and leads attached thereto to a housing.

A further object of the invention is to provide a LED spacer assembly which eliminates the utilization of glue for attaching the LED to the housing and at the same time provides a stable retention of the LED to the housing.

A further object of the invention is to provide an LED spacer assembly which permits the automated attachment of a single or a plurality of LEDs onto a housing in an environmentally clean and highly efficient manner.

A further object of the invention is to provide a method which permits the clamping of the leads of the LED to the housing in a manner which minimizes stress on the LED during the assembly process.

SUMMARY OF THE INVENTION

The present invention relates to an LED spacer assembly which comprises at least one LED having leads extending therefrom; and a housing having a first surface with at least one first passageway extending from the first surface to a second surface of the housing which is opposed to the first surface.

The at least one LED and the leads which extend therefrom are positioned in the at least one first passageway so that the LED is positioned at the first surface of the housing and so that the leads pass through the at least one first passageway and extend from the second surface of the housing.

The housing further comprises a third surface with at least one second passageway which extends from the third surface and leads to the at least one first passageway so as to be in communication with the at least one first passageway. The at least one second passageway of the housing has an extended portion, and the leads of the at least one LED comprise a bent portion which bend into the extended portion of the at least one second passageway. This permits the retention of the LED in the housing.

The present invention also relates to a method for producing an LED assembly which comprises the steps of: inserting an LED having leads extending therefrom into a first passageway of a housing so that the leads extend through the first passageway; holding the leads of the LED at a second passageway of the housing, the second passageway intersecting the first passageway and having an extended portion; and bending a portion of the leads during the holding step into the extended portion of the second passageway, thereby retaining the LED on the housing and preventing or minimizing stress on the LED and the leads attached thereto.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5 illustrates an LED assembly having a housing for holding a single LED;

FIG. 6 is a side view of the LED assembly of FIG. 5; and

FIG. 7 is a top view of the LED assembly of FIG. 5.

DESCRIPTION OF THE PREFERRED EMBODIMENTS

Figure 1:
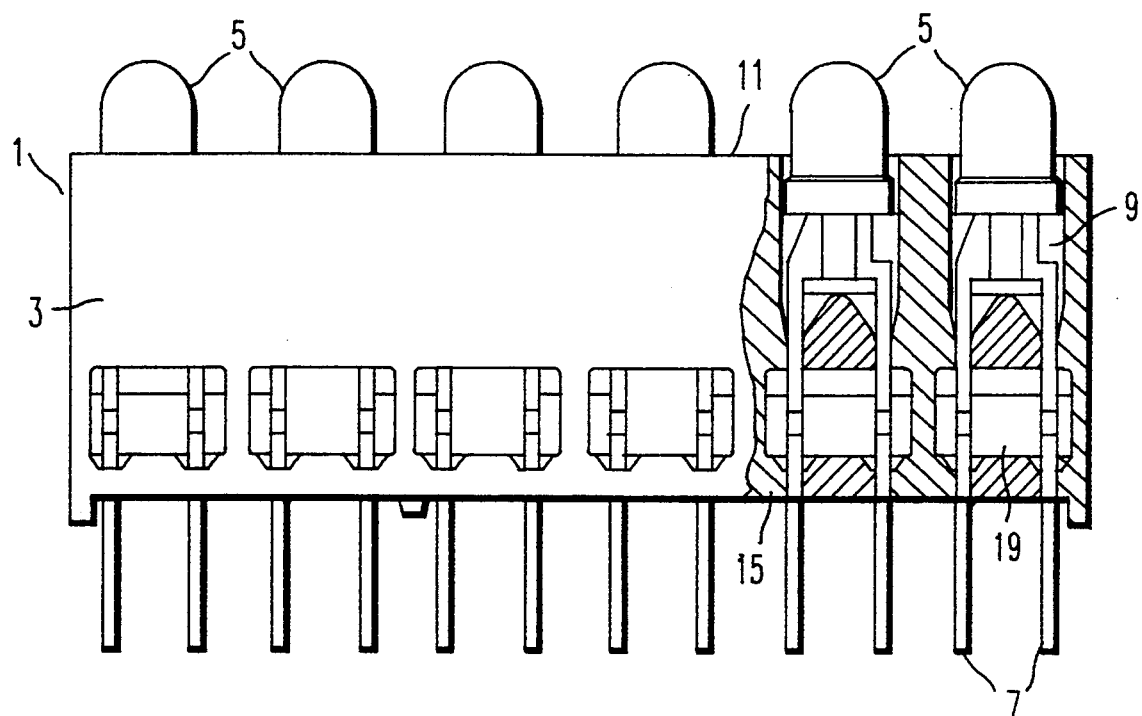
FIG. 1 illustrates the LED spacer assembly of the present invention having a housing and the LEDs with leads positioned therein.

Referring now to the drawings, wherein like reference numerals designate identical or corresponding parts throughout the several views and more particularly to FIG. 1 thereof, illustrated in FIG. 1 is an LED spacer assembly 1 which comprises a housing 3 having a plurality of LEDs 5 positioned therein. A further embodiment is illustrated in FIG. 5 in which the housing 3 is designed to hold a single LED 5. The size of the housing and the number of LEDs held thereon depends on design considerations. The LEDs 5 illustrated in the figures each comprise leads 7.

The housing 3 of FIG. 1 comprises a plurality of first passageways 9 which extend from a first surface 11 of the housing 3 to a second surface 15 of the housing 3. The leads 7 of each of the LEDs 5 are inserted into a corresponding first passageway 9 such that the leads 7 pass through the first passageway 9 and extend from the second surface 15 of the housing 3.

Figure 4:
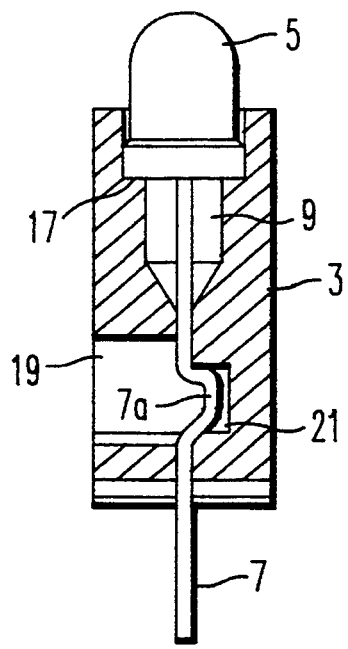
FIG. 4 is a side view through section line 4—4 of FIG. 2 of the LED spacer assembly of FIG. 1.

As illustrated in FIG. 4, the housing 3 may have a stepped portion 17 in which the LED 5 sits. The housing 3 also includes a plurality of second passageways 19 each of which intersects a corresponding one of the first passageways 9.

As further illustrated in FIG. 4, each second passageway 19 includes an extended portion 21. During the assembly of the LED spacer assembly 1, after an LED 5 is inserted in its passageway 9 such that the LED 5 sits on the stepped portion 17 and the leads 7 extend through the first passageway 9, a tool or forming die means (not shown) can be extended through the second passageway 19 so as to clamp the leads 7. At the same time, the tool or die means can be used to bend the leads 7 into the extended portion 21 so as to form a bent portion 7a which is fitted into the extended portion 21.

The bent portions 7a of the leads 7 stably retain the LED 5 as well as the leads 7 on the housing 3. Additionally, the structure of the housing 3 permits the holding of the leads 7 during the bending operation of the leads so as to prevent undue stress on the leads as well as the interconnection between the leads and the LED.

As illustrated in FIG. 1, when all of the LEDs 5 are inserted within the first passageways 9 in the housing 3, the present invention permits the automated bending of the leads 7 to form the bent portions 7a via the second passageway 19 so as to produce an LED spacer assembly in an efficient and quick manner. All that is necessary is the insertion of a tool into the second passageway 19 for holding the leads 7 and creating the bent portions 7a on the leads. The tool for the above-described forming process has dual functional capability. It can consist of a spring loaded clamp tool and the actual bend tool. During actuation, the clamp tool contacts the leads and then the bend tool forms the leads into the extended portion. During retraction, the bend tool is entirely disengaged prior to the clamp releasing the leads. Thus, during the entire forming process the leads are securely clamped. Depending on the ruggedness of the LED, the clamp fixture may not be necessary. In this case, a simple bend tool can be used to accomplish the lead form into the extended portion of the second passageway.

By utilizing the bent portions 7a of the leads 7 to retain the LED 5 within the housing 3, there is no need to utilize glues such as environmentally unfriendly glues for attaching the LEDs 5 to the housing 3. Thus, the manufacturing process for producing the LED spacer assembly 1 of the present invention can be achieved in an environmentally clean and highly efficient manner.

FIGS. 5–7 illustrate an embodiment of the present invention in which the housing 3 is designed to receive a single LED 5 and leads 7 extending therefrom. The passageways 9 and 19 as well as the insertion of the LED 5 and the leads 7 thereto is the same as in the embodiment of FIG. 1. The embodiment in which the housing 3 is designed to receive a single LED 5 provides for a very compact system in which a high degree of stability is received when the assembly is positioned on a printed circuit board. FIG. 6 is a side view of the housing illustrated in FIG. 5 while FIG. 7 illustrates a top view of the assembly of FIG. 5.

Figure 3:
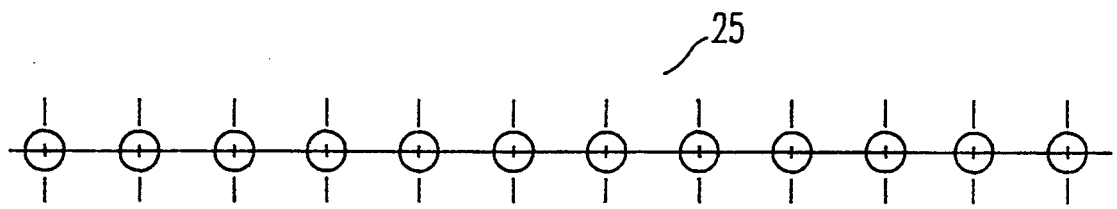
FIG. 3 is a schematic view of a recommended printed circuit board hole pattern which is usable with the LED spacer assembly of FIG. 1.

Thus, the compact square shape of the housing of the present invention, especially a single housing and LED combination as illustrated in FIG. 5, provides for a more stable seating on a printed circuit board, such as the printed circuit board 25 schematically illustrated in FIG. 3. The design of the housing 3 also permits more space for stabilizer pins.

The design of the LED spacer assembly 1 of the present invention is suitable for multi-position products (FIG. 1), and especially suitable for a single product (FIG. 5) which each use a single housing molded to a required length and height. The design is compatible with all LED styles including 2 mm, 3 mm, 5 mm, and rectangular leads. The design also provides for a superior lead spacing accuracy, especially when utilized on a multi-position product.

Figure 2:
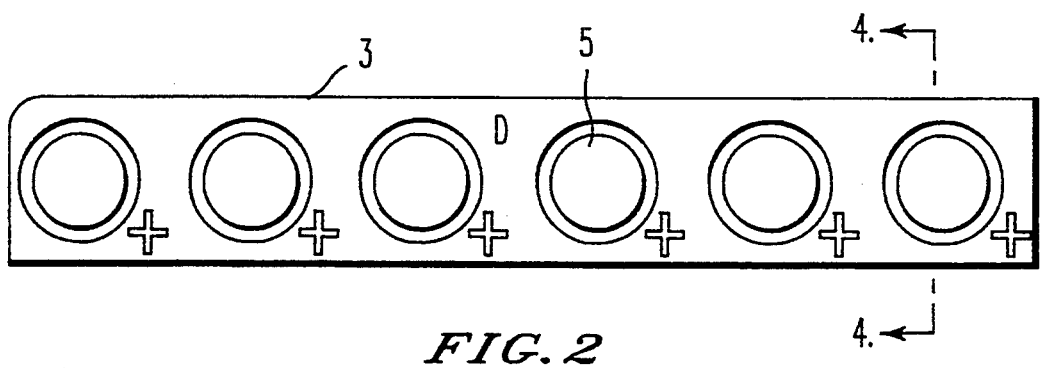
FIG. 2 is a top view of the LED spacer assembly of FIG. 1.

As illustrated in FIG. 2 of the application, which is a top view of the LED spacer assembly 1 of FIG. 1, the housing 3 permits the spacing of the LEDs 5 in accordance with a desired design consideration, however as noted above, a single LED and housing combination as shown in FIG. 5 can also be utilized.

Finally, the LED spacer assembly 1 of the present invention can be efficiently manufactured due to the fact that the design permits the leads inserted in the housing to be bent while being held, thereby minimizing stresses on the LED during the assembly process.

Obviously, numerous modifications and variations of the present invention are possible in light of the above teachings. It is therefore to be understood that, within the scope of the appended claims, the invention may be practiced otherwise than as specifically described herein.

What is claimed:

1. An LED spacer assembly comprising:
   (a) at least one LED having first and second leads extending therefrom; and
   (b) a housing having a first surface with at least one first passageway extending from said first surface to a second surface of said housing which is opposed to said first surface;
   wherein:
   (c) said at least one LED and said first and second leads extending therefrom are positioned in said at least one first passageway so that said LED is positioned at said first surface of said housing and said first and second leads pass through said at least one first passageway and extend from said second surface of said housing;
   (d) said housing comprises a third surface with at least one second passageway extending from said third surface and leading to said at least one first passageway so as to be in communication with said at least one first passageway, said at least one second passageway having an extended portion; and
   (e) said first and second leads of said at least one LED each comprise a bent portion which bends into said extended portion of said at least one second passageway and is positioned within the housing for retaining said LED in said housing;
   wherein said second passageway defines an opening having a width which is greater than a distance between said first and second leads at said second passageway so as to permit a simultaneous bending of said first and second leads to form said bent portion.

2. The LED spacer assembly according to claim 1, wherein said at least one second passageway is perpendicular to said at least one first passageway.

3. The LED spacer assembly according to claim 2, comprising a plurality of said first passageways and said second passageways with said extended portions, spacedly arranged in said housing for spacedly retaining a plurality of said LED's having leads with bent portions.

4. An LED spacer assembly comprising:
   (a) at least one LED having leads extending therefrom; and (b) a housing having a first surface with at least one first passageway extending from said first surface to a second surface of said housing which is opposed to said first surface, said first passageway having a first central longitudinal axis;

wherein:

(c) said at least one LED and said leads extending therefrom are positioned in said at least one first passageway so that said LED is positioned at said first surface of said housing and said leads pass through said at least one first passageway and extend from said second surface of said housing;

(d) said housing comprises a third surface with at least one second passageway extending from said third surface and leading to said at least one first passageway so as to be in communication with said at least one first passageway, said at least one second passageway having an extended portion and a second central longitudinal axis which intersects said first central longitudinal axis of said first passageway; and (e) said leads of said at least one LED each comprise a bent portion which bends into said extended portion of said at least one second passageway and is positioned within the housing for retaining said LED in said housing;

wherein said second passageway defines an opening having a width which permits a bending of at least one of said leads to form said bent portion.

5. The LED spacer assembly according to claim 4, wherein said at least one second passageway is perpendicular to said at least one first passageway.

6. The LED spacer assembly according to claim 5, comprising a plurality of said first passageways and said second passageways with said extended portions, spacedly arranged in said housing for spacedly retaining a plurality of said LED's having leads with bent portions.

* * * * *